(12) United States Patent
Chang et al.

(10) Patent No.: US 9,577,620 B2
(45) Date of Patent: Feb. 21, 2017

(54) PRINTED CIRCUIT ARRANGEMENT AND METHOD OF FORMING THE SAME

(71) Applicant: Agency for Science, Technology and Research, Singapore (SG)

(72) Inventors: Kok Leong Chang, Singapore (SG); Jie Zhang, Singapore (SG); Weng Yew Lee, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 242 days.

(21) Appl. No.: 14/329,913

(22) Filed: Jul. 12, 2014

(65) Prior Publication Data

US 2015/0016048 A1   Jan. 15, 2015

(30) Foreign Application Priority Data

Jul. 12, 2013   (SG) .................................. 201305367

(51) Int. Cl.
| | |
|---|---|
| G06F 7/00 | (2006.01) |
| H05K 5/00 | (2006.01) |
| H01H 9/00 | (2006.01) |
| H04L 7/00 | (2006.01) |
| H03H 11/26 | (2006.01) |
| H03K 5/05 | (2006.01) |
| H05K 1/02 | (2006.01) |
| H05K 1/03 | (2006.01) |
| H05K 1/09 | (2006.01) |
| H05K 1/16 | (2006.01) |

(52) U.S. Cl.
CPC ............... *H03K 5/05* (2013.01); *H05K 1/0248* (2013.01); *H05K 1/0393* (2013.01); *H05K 1/095* (2013.01); *H05K 1/16* (2013.01); *Y10T 29/49126* (2015.01)

(58) Field of Classification Search
None
See application file for complete search history.

(56) References Cited

U.S. PATENT DOCUMENTS

| | | | | |
|---|---|---|---|---|
| 6,777,995 B1 * | 8/2004 | Harrison | ................ | H03K 5/135 327/271 |
| 9,020,085 B1 * | 4/2015 | Gagnon | .................... | H03L 7/00 375/355 |
| 2007/0071253 A1 * | 3/2007 | Sato | .................... | G10L 21/0208 381/94.3 |

* cited by examiner

*Primary Examiner* — Yolanda Cumbess
(74) *Attorney, Agent, or Firm* — Winstead, P.C.

(57) ABSTRACT

In various embodiments, a printed circuit arrangement may be provided. The printed circuit arrangement may include a processor circuit. The printed circuit arrangement may further include a printed main circuit arrangement in electrical connection with a first input node of the processor circuit. The printed main circuit arrangement may be configured to receive at least one input signal and generate a main circuit signal based on the at least one input signal after a first delay from receiving the at least one input signal. The printed circuit arrangement may further include a printed reference circuit arrangement in electrical connection with a second input node of the processor circuit. The printed reference circuit arrangement may be configured to receive a further input signal, may have a second delay and may be configured such that the second delay adapts to the first delay.

20 Claims, 14 Drawing Sheets

100d

100e

Circuit

800 provide a processor circuit having a first input node, a second input node and an output node

802 electrically connect a printed main circuit arrangement with the first input node of the processor circuit

804 electrically connect a printed reference circuit arrangement with the second input node of the processor circuit

806

US 9,577,620 B2

PRINTED CIRCUIT ARRANGEMENT AND METHOD OF FORMING THE SAME

CROSS-REFERENCE TO RELATED APPLICATIONS

This application claims the benefit of priority of SG application No. 201305367-3 filed Jul. 12, 2013, the contents of it being hereby incorporated by reference in its entirety for all purposes.

TECHNICAL FIELD

Various aspects of this disclosure relate to printed circuit arrangements and methods of forming the same.

BACKGROUND

Printing is a well-established technology to deposit and pattern color inks on an arbitrary surface. Printed electronics leverage on printing technologies to manufacture electronics and optoelectronics for low-cost applications. In printed electronics, functional inks replace the color inks in graphic arts to produce electronic circuits. Printing yields almost naked-eye-perfect patterned layers that are sufficient for high-quality graphic arts. However for electronics, the dimensions and morphology of the patterned layers, as well as their repeatability significantly affect electrical behavior and functionality. Currently, the resolution of the graphic art printing at 1-100 micrometers, is still far from the resolutions (~10 nanometers) achieved using vacuum-based traditional silicon-based (Si-based) microelectronics processes. In addition, the repeatability and reproducibility of printed transistors and devices are far from the standards required by the Si-based microelectronics due to the printing process control, printed structure dimension control, coarse dimensions, ink uniformity, ink rheology control, etc. The stability of printed transistor and devices are also poorer compared to Si-based microelectronics due to the poor stability of functional inks, particularly organic-based functional inks.

SUMMARY

In various embodiments, a printed circuit arrangement may be provided. The printed circuit arrangement may include a processor circuit having a first input node, a second input node and an output node. The printed circuit arrangement may further include a printed main circuit arrangement in electrical connection with the first input node of the processor circuit. The printed main circuit arrangement may be configured to receive at least one input signal and generate a main circuit signal based on the at least one input signal after a first delay from receiving the at least one input signal. The printed circuit arrangement may further include a printed reference circuit arrangement in electrical connection with the second input node of the processor circuit. The printed reference circuit arrangement may be configured to receive a further input signal. The printed reference circuit arrangement may have a second delay and may be configured such that the second delay adapts to the first delay. The printed reference circuit arrangement may further be configured to generate a reference circuit signal based on the further input signal after the second delay from receiving the further input signal. The processor circuit may be configured to generate an output signal at the output node based on the main circuit signal in response to the reference circuit signal.

In various embodiments, a method of forming a printed circuit arrangement may be provided. The method may include providing a processor circuit having a first input node, a second input node and an output node. The method may further include electrically connecting a printed main circuit arrangement with the first input node of the processor circuit. The printed main circuit arrangement may be configured to receive at least one input signal and generate a main circuit signal based on the at least one input signal after a first delay from receiving the at least one input signal. The method may also include electrically connecting a printed reference circuit arrangement with the second input node of the processor circuit. The printed reference circuit arrangement may have a second delay and may be configured such that the second delay adapts to the first delay and may be configured to generate a reference circuit signal based on the further input signal after the second delay from receiving the further input signal. The processor circuit may be configured to generate an output signal at the output node based on the main circuit signal in response to the reference circuit signal.

BRIEF DESCRIPTION OF THE DRAWINGS

The invention will be better understood with reference to the detailed description when considered in conjunction with the non-limiting examples and the accompanying drawings, in which:

FIG. 8 shows a schematic of forming a printed circuit arrangement.

DETAILED DESCRIPTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, and logical changes may be made without departing from the scope of the invention. The various embodiments are not necessarily mutually exclusive, as some embodiments can be combined with one or more other embodiments to form new embodiments.

In order that the invention may be readily understood and put into practical effect, particular embodiments will now be described by way of examples and not limitations, and with reference to the figures.

For avoidance of doubt, the term "activated" may refer to a state of a transistor being turned on so that a current substantially equal to or more than a sub-threshold current flows between a first controlled electrode and a second controlled electrode. Accordingly, the term "deactivated" may refer to a state of a transistor being turned off so that no current or a sub-threshold current flows between a first controlled electrode and a second controlled electrode.

In various embodiments, a "circuit" may be understood as any kind of a logic implementing entity, which may be special-purpose circuitry or a processor executing software stored in a memory, firmware, or any combination thereof. Thus, in various embodiments, a "circuit" may be a hard-wired logic circuit or a programmable logic circuit such as a programmable processor, e.g. a microprocessor (e.g. a Complex Instruction Set Computer (CISC) processor or a Reduced Instruction Set Computer (RISC) processor). A "circuit" may also, where appropriate, be a processor executing software, e.g. any kind of computer program (e.g. a computer program using a virtual machine code such as Java).

Figure 1A:
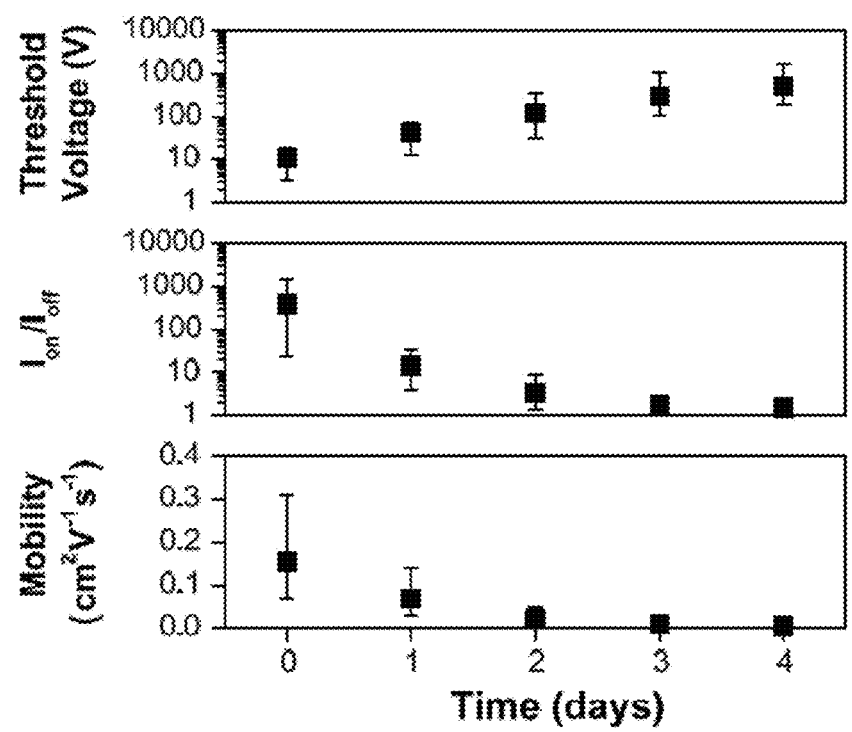
FIG. 1A is a graph showing parameters such as threshold voltage, ratio of channel current of an activated transistor to channel current of a deactivated transistor ($I_{on}/I_{off}$) as well as mobility of a batch of conventional printed transistors plotted as a function of time (in days).

FIG. 1A is a graph 100$a$ showing parameters such as threshold voltage, ratio of channel current of an activated transistor to channel current of a deactivated transistor ($I_{on}/I_{off}$) as well as mobility of a batch of conventional printed transistors plotted as a function of time (in days). The batch of transistors may be subjected to ambient conditions. It may be observed that all the transistor parameters are widely distributed even when the batch of transistors is measured immediately after printing (denoted in FIG. 1 by time=0 days). This is largely due to the aforesaid challenges pertaining to printing resolution and repeatability. Next, the batch of transistors is left at ambient conditions and measured daily. It may be observed that the transistor parameters degrade quickly with time, in particular, the transistors conduct less current (mobility decreases) and tend to become more leaky (threshold voltage increases and $I_{on}/I_{off}$ decreases).

Figure 1B:
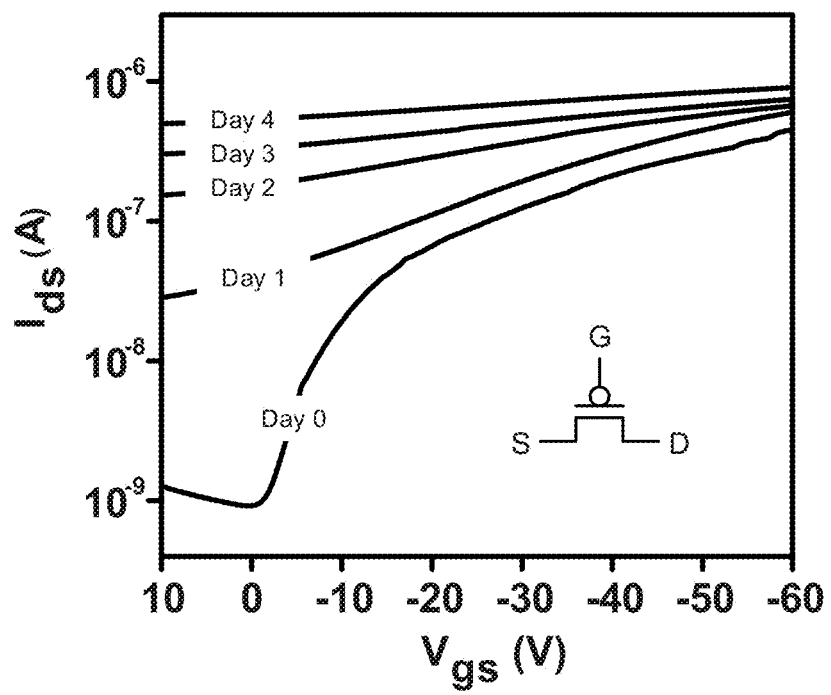
FIG. 1B is a graph of the channel current ($I_{ds}$) in amperes (A) against gate-to-source voltage ($V_{gs}$) in volts (V) of a printed transistor.
Figure 1C:
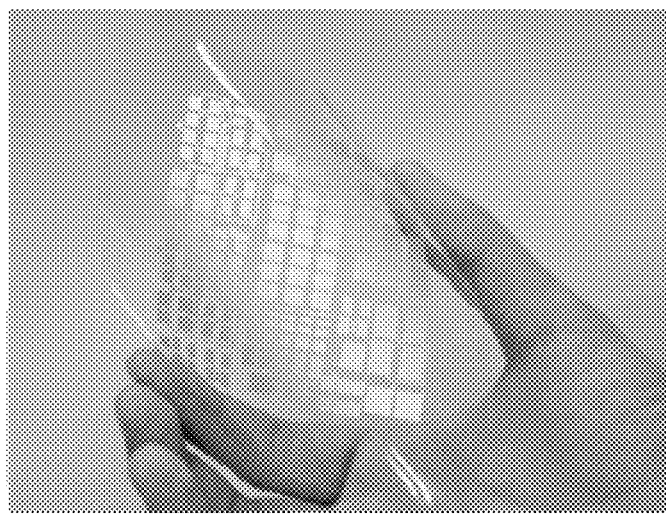
FIG. 1C is a picture showing a printed circuit on a flexible substrate.
Figure 1D:
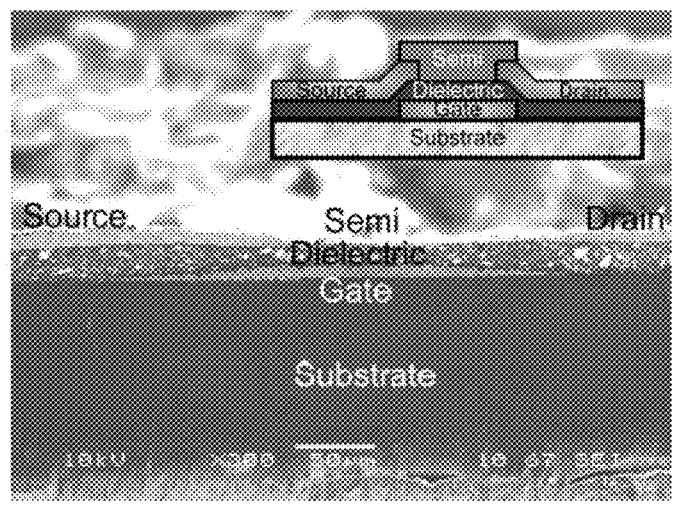
FIG. 1D is an transmission electron microscopy image showing a cross-sectional view of a printed transistor. The inset of FIG. 1D shows the schematic of a printed transistor.

FIG. 1B is a graph 100$b$ of the channel current ($I_{ds}$) in amperes (A) against gate-to-source voltage ($V_{gs}$) in volts (V) of a printed transistor. FIG. 1B shows that the electrical behaviour of printed transistor may vary change time. FIG. 1C is a picture 100$c$ showing a printed circuit on a flexible substrate. FIG. 1D is an transmission electron microscopy image 100$d$ showing a cross-sectional view of a printed transistor. The inset of FIG. 1D shows the schematic of a printed transistor.

Synchronous digital logic circuits may be operated by a global sequencing element commonly known as the clock. Error-free operation may be assured by operating the clock slower than all circuits therein at all conditions (especially in the worst-case condition, where circuits operate the slowest). This approach may be used in Si-based digital logic circuits and these types of circuits may be commonly known as synchronous logic circuits, whereby the clock synchronizes all logic circuits. Generally, the worst-case condition in silicon-based circuits may be well established as 'process corners' and is usually well modeled/predictable over the entire circuit/operating conditions.

In contrast, the worst-case condition for printed circuits may be, until now, somewhat unpredictable/difficult to model due to widely distributed and potentially degrading device parameters. One of the principle challenges of printed electronics is to keep the parameters of devices, i.e. transistor mobility uniform (or predictable) over a large area—which typically spans up to a few square meters.

The clock delay is ascertained during design with the knowledge of all circuit delays at all conditions (especially in the worst case condition). Hence, with the clock delay fixed after design, the functionality of circuits may be only warranted if the conditions do not change beyond the worst case condition. This approach is well-established in Si-based digital synchronous logic circuits.

For printed electronic circuits, it may be challenging to ascertain a worst case condition because the circuit delay variations are higher (due to higher variations from printing processes, printable functional inks, interface interactions, etc.) and circuits are prone to degradation with different operating conditions and time. Conventional methods used to overcome such problems typically require clock delay adjustments to accommodate the circuit delay variations. It may be challenging for digital synchronous logic to adjust the clock delay to accommodate the actual circuit delays as the operating conditions change, or as the circuit degrades, like for printed electronics.

Figure 1E:
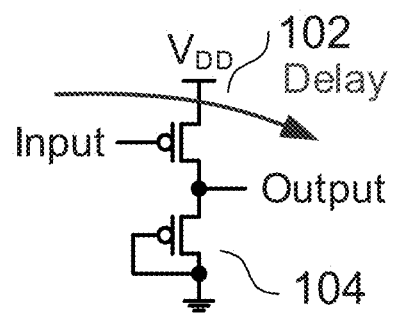
FIG. 1E is a schematic of an examplary circuit arrangement that may be implemented in printed electronics.

FIG. 1E is a schematic 100$e$ of an examplary circuit arrangement that may be implemented in printed electronics. The circuit arrangement may include a first transistor 102 and a second transistor 104. The gate of the first transistor 102 may be configured to receive an input signal while an output signal may be generated at the source of the first transistor 102. The drain of the first transistor 102 may be coupled to a supply voltage VDD. The drain of the second transistor 104 is coupled to the source of the first transistor 102 while the gate and source of the second transistor 104 is coupled to ground. There is a delay from the time of applying the input voltage to the circuit arrangement and the time when the output voltage is generated. The delay may be taken as a time interval between change of an input and the output being changed or valid as a result of the change in the input. The delay may change due to mobility, threshold voltage and/or ratio of channel current of an activated transistor to channel current of a deactivated transistor ($I_{on}/I_{off}$).

Figure 1F:
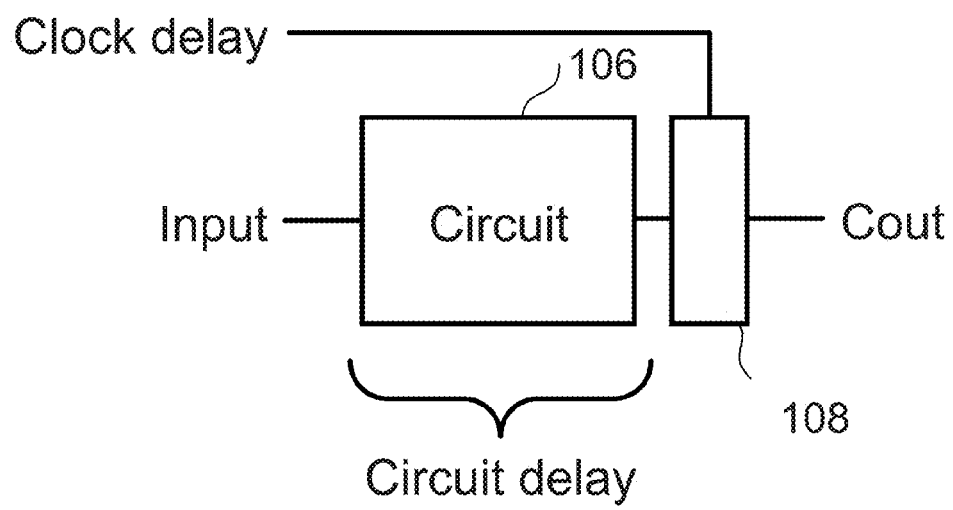
FIG. 1F is a schematic of a sychronous circuit arrangement.

FIG. 1F is a schematic of a sychronous circuit arrangement. The circuit arrangement may include a circuit 106 and a memory 108 coupled to the circuit 106. The memory 108 may also be coupled to a clock signal while the circuit 106 may be coupled to an input signal (Input). An output signal (Cout) is generated from the memory 108. There is a circuit delay between the circuit 106 receiving the input signal and the circuit 106 generating a circuit signal to the memory 108. The memory 108 is used to store valid output from circuit 106, i.e. circuit signal.

Figure 1G:
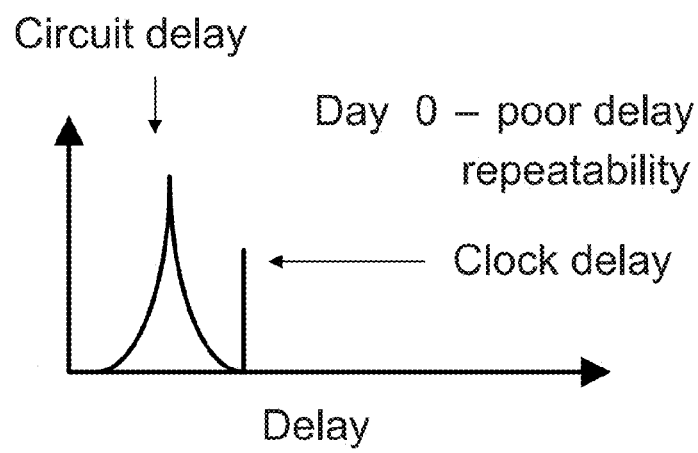
FIG. 1G is a graph of probability against delay of circuit delay and clock delay of the circuit arrangement in FIG. 1F during day 0 if the circuit arrangement is implemented using printed electronics.
Figure 1H:
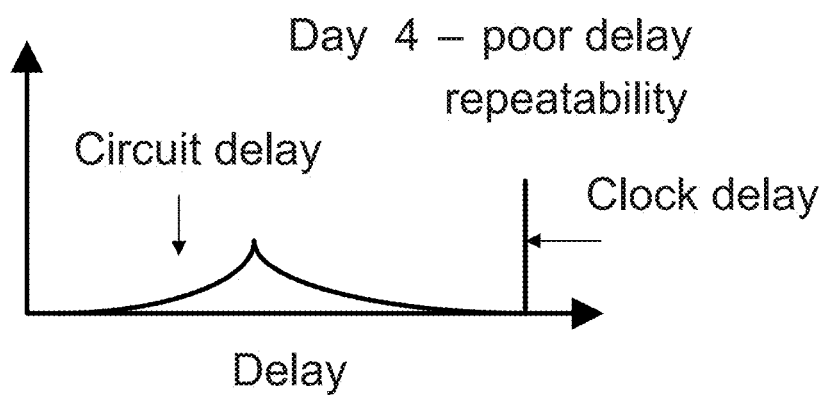
FIG. 1H is a graph of probability against delay of circuit delay and clock delay of the circuit arrangement in FIG. 1F during day 4 if the circuit arrangement is implemented using printed electronics.

FIG. 1G is a graph 100g of probability against delay of circuit delay and clock delay of the circuit arrangement in FIG. 1F during day 0 if the circuit arrangement is implemented using printed electronics. FIG. 1H is a graph 100h of probability against delay of circuit delay and clock delay of the circuit arrangement in FIG. 1F during day 4 if the circuit arrangement is implemented using printed electronics. In order for the circuit arrangement to function, the clock delay is required to be applied to the memory 108 later than the circuit signal. In other words, the clock delay is required to be greater than the circuit delay. As shown in FIGS. 1G and 1H, the circuit delay for each day may vary over a range. As such, the printed circuit arrangement may suffer from poor delay repeatability. Further, comparing FIG. 1G and FIG. 1H, the range of circuit delay may increase and the average circuit delay may also increase over time. Further, the clock delay may also shift, indicating poor delay stability. It may thus be inpractical to design synchronous circuits using flexible electronics due to intractable delays.

In addition to issues illustrated in FIGS. 1G-1H, the broad range of operating parameter deviation, results of printing and printable materials, may further extend the challenges in printed circuits design for usable applications.

Printed electronics is now at present largely limited to only sub-blocks of trivial applications, e.g. passive sensor strips (the electronic transducers are vacuum-based), antennas for RFID tags (the electronic modulators/demodulators are Si-based electronics) due to the abovementioned issues. Such applications may require additional efforts for integrating Si-based electronic blocks with printed blocks which add to the manufacturing cost and thereby diluting the primary motivation for printed electronics, i.e. low costs. In other words, because such applications may only be partly printed, additional efforts (thus higher cost) may be required to integrate printed electronics with silicon-based sub-blocks, thereby diluting the primary motivation for printed electronics.

This is one of the main challenges for widespread adoption of printed electronics for low-cost applications.

To be able to create useful electronics through an all integrated printing process, circuit designs that are less susceptible to the variations and inconsistencies of printed components may be required. There may be a need for highly repeatable printing processes and/or circuit designs that are less susceptible to performance variations of transistors.

Figure 2:
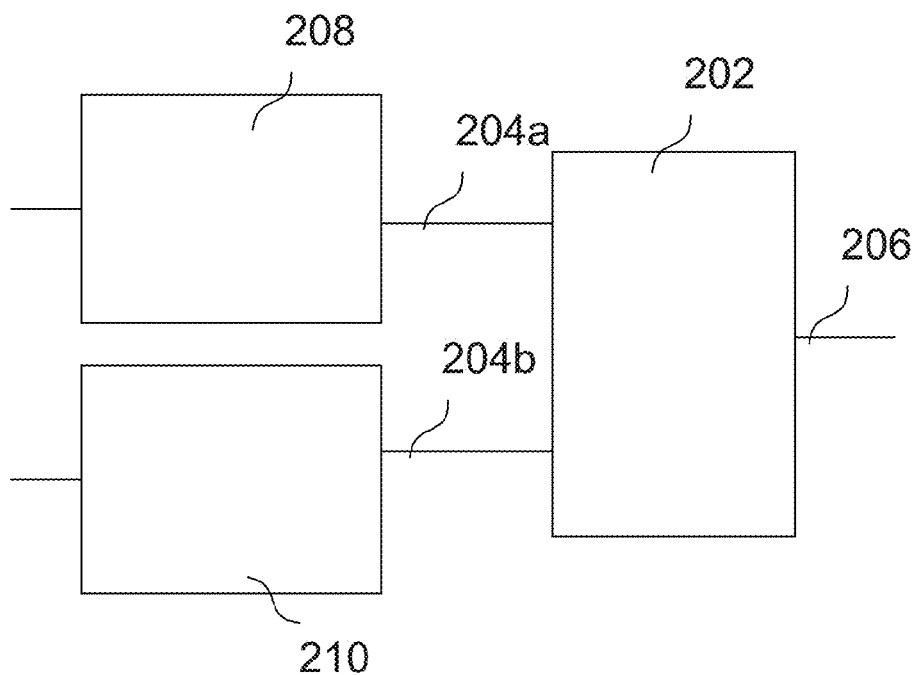
FIG. 2 is a schematic of a printed circuit arrangement according to various embodiments.

FIG. 2 is a schematic 200 of a printed circuit arrangement according to various embodiments. The printed circuit arrangement may include a processor circuit 202 having a first input node 204a, a second input node 204b and an output node 206. The printed circuit arrangement may further include a printed main circuit arrangement 208 in electrical connection with the first input node 204a of the processor circuit 202. The printed main circuit arrangement 208 may be configured to receive at least one input signal and generate a main circuit signal based on the at least one input signal after a first delay from receiving the at least one input signal. The printed circuit arrangement may further include a printed reference circuit arrangement 210 in electrical connection with the second input node 204b of the processor circuit 202. The printed reference circuit arrangement 210 may be configured to receive a further input signal. The printed reference circuit arrangement 210 may have a second delay and may be configured such that or so that the second delay adapts to the first delay. The printed reference circuit may be further configured to generate a reference circuit signal based on the further input signal after the second delay from receiving the further input signal. The processor circuit 202 may be configured to generate an output signal at the output node 206 based on the main circuit signal in response to the reference circuit signal.

In other words, the printed reference circuit may include a processor circuit 202, a printed main circuit arrangement 208 coupled to the processor circuit 202 via a first input node 204a, and a printed reference circuit arrangement 210 coupled to the processor circuit 202 via a second input node 204b. The printed main circuit arrangement 208 may be configured to generate a main circuit signal to the processor circuit 202 after a first delay of receiving at least one input signal. The printed reference circuit arrangement 210 may be configured to generate an asynchronous reference circuit signal to the processor circuit 202 after a second delay of receiving a further signal. The second delay may be so that it is correlated to the first delay. The processor circuit 202 may be configured to generate an output signal upon receiving the asynchronous reference circuit signal.

Various embodiments may provide a unique digital logic circuit design approach that is insensitive to the variations of printed components and increases the consistency and yield of printed circuits.

Various embodiments may overcome the problems of degrading transistor parameters and/or sparse distribution of transistor parameters by measuring the delay of circuits during operation. This approach may be termed as digital asynchronous logic. Various embodiments may include correlating every circuit delay with a printed delay circuit (also known as matched delay). The delay circuits may be used to sequence the actual circuits. The degradation and/or distribution of transistor parameters may be substantially identical or similar when the delay circuits are printed in close proximity to the actual circuits.

The term "transistor" used herein may include a metal oxide semiconductor field effect transistor (MOSFET). In various embodiments, the first controlled electrode may refer to a drain electrode and the second controlled electrode may refer to a source electrode. In various alternate embodiments, the first controlled electrode may refer to a source electrode and the second controlled electrode may refer to a drain electrode. The transistor may also have a control electrode, which may also be referred to as a gate electrode.

The transistor may alternatively be a bipolar junction transistor. In various embodiments, the first controlled electrode may refer to a collector electrode and the second controlled electrode may refer to an emitter electrode. In various alternate embodiments, the first controlled electrode may refer to an emitter electrode and the second controlled electrode may refer to a collector electrode. The transistor may also have a control electrode, which may also be referred to as a base electrode.

In various embodiments, a printed circuit arrangement may refer to a circuit arrangement in which at least a portion of the circuit arrangement is printed, e.g. with conductive ink. The printed portion may be a component of the circuit arrangement, such as a transistor, or may be part of the component. The printed portion may additionally or alternatively include the electrical connections between components. In various embodiments, the components and the electrical connections may be printed.

Various embodiments seek to solve the poor stability of printed circuits as printed transistor parameters degrade. In digital circuits, transistor parameters may dictate the delay of circuits. For printed transistors, the standard deviation of the transistor performance may have a wide range and their parameter may drift over time due to the environment effect on printable semiconductor, electrodes and dielectric materials. Variation of transistor parameters may result in circuit delay variations, which causes digital logic circuits to fail because the worst-case condition assumed during design stage has been violated.

Various embodiments may also address large margins that decrease the circuit performance due to the large distribution of printed transistor parameters. When printed digital circuits are designed for worst-case conditions, large margins may be required due to the large statistical spread of printed transistor parameters. Large delay margins may unnecessarily reduce the operating speed of the digital circuit, especially at typical and best case conditions.

In various embodiments, the second delay may be within a predetermined range of the first delay. The second delay may be substantially equal to the first delay. The second delay may be adapted to the first delay by the printed reference circuit arrangement 210 being configured to degrade or age at a rate substantially equal to or correlated to the printed main circuit arrangement 208. The printed reference circuit arrangement 210 may have a rate of degradation substantially equal to a rate of degradation of the printed main circuit arrangement 208. The printed reference circuit arrangement 210 may have a rate of degradation substantially correlated (e.g. directly proportional) to a rate of degradation of the printed main circuit arrangement 208.

In various embodiments, the printed circuit arrangement is configured so that the printed main circuit arrangement 208 and the printed circuit arrangement 210 experience or are exposed to the same environment or similar environments. In various embodiments, the printed reference circuit arrangement 210 may be within a predetermined distance from the printed main circuit arrangement 208. The printed reference circuit arrangement 210 may be formed or arranged for instance within 100 cm, e.g. within 50 cm, e.g. within 10 cm, e.g. within 5 cm, e.g. within 1 cm of the printed main circuit arrangement 208. The printed circuit arrangement 210 and the printed main reference 208 may be on the same plane or may be on different planes.

By forming or arranging the printed reference circuit arrangement 210 within the predetermined distance from the printed main circuit arrangement 208, the printed reference circuit arrangement 210 may be exposed to similar conditions (e.g. heat, humidity etc.) as the main reference circuit arrangement 208 and may thus be configured to degrade or age at a rate substantially equal to or correlated to the printed main circuit arrangement 208.

The printed main circuit arrangement 208 may be or may include a logic circuit.

Various embodiments seek to overcome the problems of degrading transistor parameters and/or large distribution of transistor parameters by measuring the delay of circuits during operation—namely digital asynchronous logic. Various embodiments may address the varying delay caused by degradation or aging in printed circuit arrangements. Digital asynchronous logic is typically used in silicon-based electronic circuits for speed and energy benefits. In contrast, various embodiments may exploit digital asynchronous logic to overcome the problem of degradation and/or large distribution of transistor parameters for more robust printed circuits.

Various embodiments may correlate the delay of a printed main circuit arrangement 208 (i.e. an actual circuit) with a printed reference circuit arrangement 210. The printed reference circuit arrangement 210 may be used to sequence the printed main circuit arrangement 208. This approach may also be referred to as a matched delay approach.

The degradation and/or distribution of transistor parameters may be synchronized because the printed reference circuit arrangement 210 is printed within the predetermined distance (i.e. in close proximity) to the printed main circuit arrangement 208, i.e. the actual circuits.

The printed reference circuit arrangement 210 may be or may include an asynchronous circuit. The printed reference circuit arrangement 210 may be configured to receive a further input signal and after a second delay, generate a reference circuit signal, which acts as an enable signal to the processor circuit 202. The printed reference circuit arrangement 210 may be configured so that the second delay is matched or correlated to the first delay of the main circuit arrangement 208 even when the first delay varies, e.g. by degradation or aging over time.

The printed reference circuit arrangement 208 may include a match delay circuit arrangement. The match delay circuit arrangement may be configured to receive the further input signal. The match delay circuit arrangement may be configured to degrade or age at a rate substantially equal to or correlated to the printed main circuit arrangement 208. In addition, the match delay circuit arrangement may be within the predetermined distance from the printed main circuit arrangement 208. The match circuit delay circuit arrangement may be the portion of the printed reference circuit arrangement configured to have a delay (i.e. second delay) to match or correlate to the delay (i.e. the first delay) of the printed main circuit arrangement 208.

The printed main circuit arrangement 208 may be or may include a logic circuit. In various alternate embodiments, the printed reference circuit arrangement may be or may include a further logic circuit complementary to the logic circuit.

The printed reference circuit arrangement 208 may further include a control element such as a Muller-C element. The control element may be coupled between the match delay circuit and the processor circuit 202. The control element may be configured to receive an additional input signal.

The Muller-C element may include a first input, a second input and an output. The first input of the Muller-C element may be coupled to the match delay circuit. The output of the Muller-C element may be coupled to the processor circuit 202. The second input of the Muller-C element may be configured to receive an additional input signal In various embodiments, the main circuit arrangement 208 may be or may include an adder or summer circuit, for instance a full adder or a half-adder circuit. The main circuit arrangement 208 may alternatively or additionally include a subtractor circuit, a multiplier circuit and/or any other suitable digital circuits.

In various embodiments, the processor circuit 202 may be or may include a memory circuit. The processor circuit 202 may be configured to generate the output signal at the output node upon receiving the reference circuit signal.

The printed main circuit arrangement 208 may include conductive ink printed on a substrate. The printed reference circuit arrangement 210 may include conductive ink printed on the substrate. The processor circuit 202 may also be a printed circuit arrangement and may include conductive ink printed on the substrate. Examples of conductive inks may include metallic particles such as silver particles, copper particles and conductive polymers. The substrate may be a rigid substrate or a flexible substrate.

In various embodiments, the printed main circuit arrangement 208 may include at least one printed electrical component. The printed reference circuit arrangement 210 may also include at least one printed electrical component. Examples of electrical components may include transistors such as MOSFETs and BJTs as well as resistors. In various embodiments, the processor circuit 202 may also include at least one printed electrical component.

Figure 3:
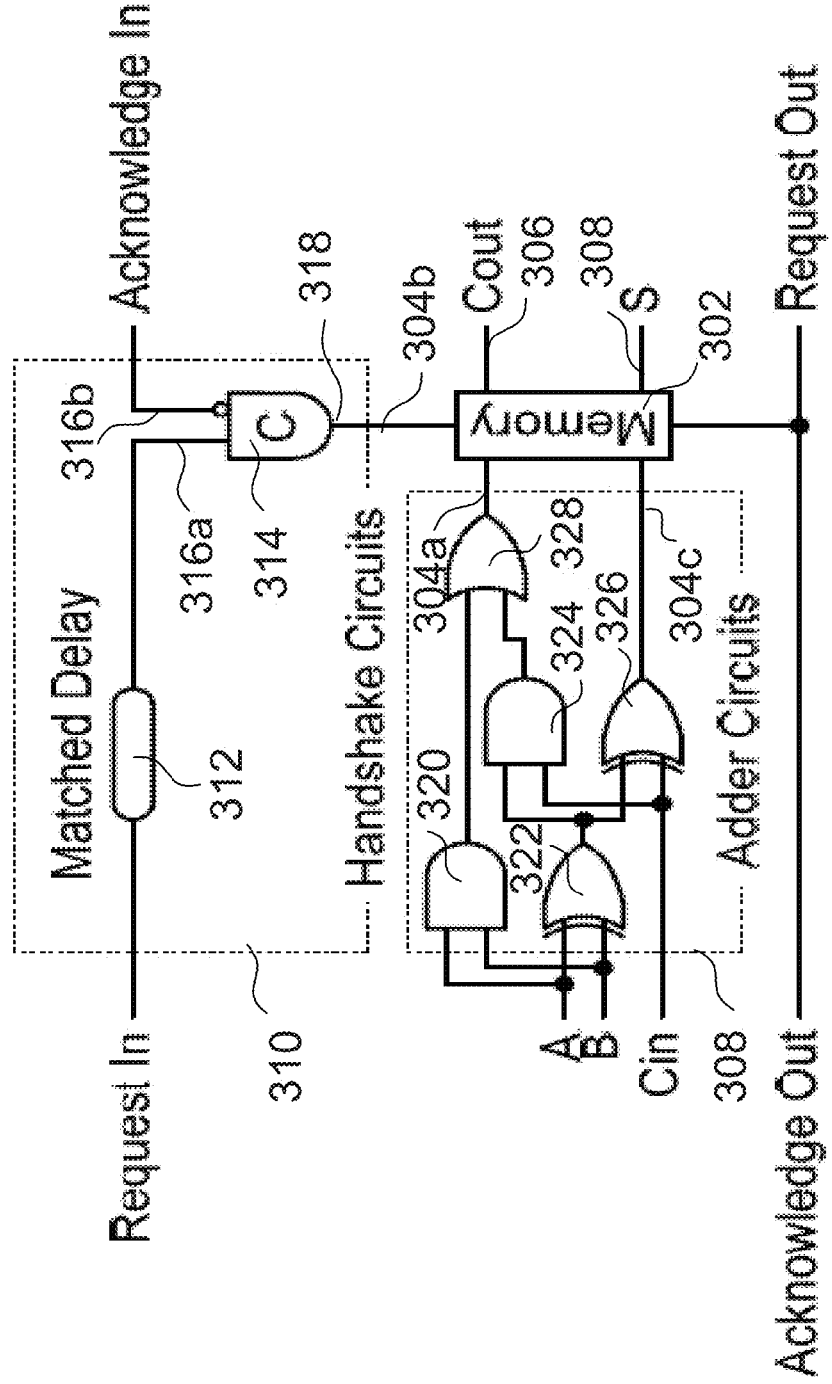
FIG. 3 is a schematic of a printed circuit arrangement according to various embodiments.

FIG. 3 is a schematic 300 of a printed circuit arrangement according to various embodiments. The printed circuit arrangement may include a processor circuit 302 having a first input node 304a, a second input node 304b and an output node 306. The printed circuit arrangement may further include a printed main circuit arrangement 308 in electrical connection with the first input node 304a of the processor circuit 302. The printed main circuit arrangement 308 may be configured to receive at least one input signal (denoted as A, B, Cin) and generate a main circuit signal based on the at least one input signal after a first delay from receiving the at least one input signal. The printed circuit arrangement may further include a printed reference circuit arrangement 310 in electrical connection with the second input node 304b of the processor circuit 302. The printed reference circuit arrangement 310 may be configured to receive a further input signal (denoted as Request In). The printed reference circuit arrangement 310 may have a second delay and may be configured such that or so that the second delay adapts to the first delay. The printed reference circuit may be further configured to generate a reference circuit signal based on the further input signal after the second delay from receiving the further input signal. The processor circuit 302 may be configured to generate an output signal (denoted as Cout) at the output node 306 based on the main circuit signal in response to the reference circuit signal.

In various embodiments, the second delay may be within a predetermined range of the first delay. The second delay may be substantially equal to the first delay. The second delay may be adapted to the first delay by the printed reference circuit arrangement 310 being configured to degrade or age at a rate substantially equal to or correlated to the printed main circuit arrangement 308. The printed reference circuit arrangement 310 may have a rate of degradation substantially equal to a rate of degradation of the printed main circuit arrangement 308. The printed reference circuit arrangement 310 may have a rate of degradation substantially correlated (e.g. directly proportional) to a rate of degradation of the printed main circuit arrangement 308.

In various embodiments, the printed circuit arrangement is configured so that the printed main circuit arrangement 308 and the printed circuit arrangement 310 experience or are exposed to the same environment or similar environments. In various embodiments, the printed reference circuit arrangement 310 may be within a predetermined distance from the printed main circuit arrangement 308. The printed reference circuit arrangement 310 may be formed or arranged for instance within 100 cm, e.g. within 50 cm, e.g. within 10 cm, e.g. within 5 cm, e.g. within 1 cm of the printed main circuit arrangement 308. The printed circuit arrangement 310 and the printed main reference 308 may be on the same plane or may be on different planes.

By forming or arranging the printed reference circuit arrangement 310 within the predetermined distance from the printed main circuit arrangement 308, the printed reference circuit arrangement 310 may be exposed to similar conditions (e.g. heat, humidity etc.) as the main reference circuit arrangement 308 and may thus be configured to degrade or age at a rate substantially equal to or correlated to the printed main circuit arrangement 308.

The printed main circuit arrangement 308 may be or may include a logic circuit.

The printed reference circuit arrangement 310 may be or may include an asynchronous circuit. The printed reference circuit arrangement 310 may be configured to receive the further input signal (denoted in FIG. 3 as Request In) and after a second delay, generate a reference circuit signal, which acts as an enable signal to the processor circuit 302. The printed reference circuit arrangement 310 may be configured so that the second delay is matched or correlated to the first delay of the main circuit arrangement 308 even when the first delay varies, e.g. by degradation or aging over time.

The printed reference circuit arrangement 308 may include a match delay circuit arrangement 312. The match delay circuit arrangement 312 may be configured to receive the further input signal. The match delay circuit arrangement 312 may be configured to degrade or age at a rate substantially equal to or correlated to the printed main circuit arrangement 308. In addition, the match delay circuit arrangement 312 may be within the predetermined distance from the printed main circuit arrangement 308. The match delay circuit arrangement 312 may be the portion of the printed reference circuit arrangement 310 configured to have a delay (i.e. second delay) to match or correlate to the delay (i.e. the first delay) of the printed main circuit arrangement 308.

The printed reference circuit arrangement 308 may further include a control element such as a Muller-C element 314. The Muller-C element 314 may include a first input 316a, a second input 316b and an output 318. The first input 316a of the Muller-C element 314 may be coupled to the match delay circuit 312. The output 318 of the Muller-C element 314 may be coupled to the processor circuit 302, i.e. via the second input node 304b. The second input 316b of the Muller-C element 302 may be configured to receive an additional input signal (Acknowledge In). The printed reference circuit arrangement 308 may also be referred to as a handshake circuit.

In various embodiments, the main circuit arrangement 308 may be or may include an adder or summer circuit. The main circuit arrangement 308 may be or include a 1-bit full adder.

The main circuit arrangement 308 may include a first AND gate 320 with a first input for receiving input signal A and a second input for receiving input signal B. The main circuit arrangement 308 may also include a first XOR gate 322 with a first input for receiving the input signal A and the second input for receiving input signal B. The output of the first XOR gate 322 may be coupled to a first input of a second AND gate 324 as well as a first input of a second XOR gate 326. A second input of the second AND gate 324 and a second input of the second XOR gate 326 may be configured to receive input signal Cin. The output of the first AND gate 320 may be coupled to a first input of a OR gate 328. The output of the second AND gate 324 may be coupled to a second input of the OR gate 328. The output of the OR gate 328 may be coupled to the first input node 304a of processor circuit 302. The processor circuit 302 may further include a third input node 304c for receiving the output of second XOR gate 326.

In various embodiments, the processor circuit 302 may be or may include a memory circuit. The processor circuit 302 may be configured to generate the output signal at the output node 306 upon receiving the reference circuit signal, i.e via second input node 304b. The processor circuit 302 may have an output node 306 and a further output node 308. The processor circuit 302 may be configured to generate a further output signal (denoted as S) at the output node 308 based on a further main circuit signal in response to the reference circuit signal. The main circuit signal may be generated at the first input node 304a and the further main circuit signal may be generated at the third input node 304c. Referring to FIG. 3, the output of OR gate 328 may be the main circuit signal and the output of second XOR gate 326 may be the further main circuit signal.

The printed reference circuit arrangement 308 may be configured to activate the processor circuit 302 to store the results of the addition, i.e. output of the OR gate 328 and output of the second XOR gate 326. For instance, the Muller-C element 314 may be configured to generate a high reference circuit signal at output node 314 of the Muller C element 314 when the Acknowledge In signal is low and when the Muller C element 314 receives a signal from the matched delay circuit arrangement 312. The matched delay circuit arrangement 312 generates the high reference circuit signal after a second delay from when a Request In signal is applied to the matched delay circuit arrangement 312. The high reference circuit signal may activate the processor circuit 302 to store the outputs of the addition generated by the printed main circuit arrangement 308. In other words, the processor circuit 302 may be activated by the handshake circuit 310, which may include the matched delay circuit arrangement 312 and the Muller C-element 314 in various implementations.

The processor circuit 302 may also be configured to generate Request Out and Acknowledge Out signals.

The printed main circuit arrangement 308 may include conductive ink printed on a substrate. The printed reference circuit arrangement 310 may include conductive ink printed on the substrate. The processor circuit 302 may also be a printed circuit arrangement and may include conductive ink printed on the substrate. Examples of conductive inks may include metallic particles such as silver particles, copper particles and conductive polymers. The substrate may be a rigid substrate such as silicon. In various alternate embodiments, the substrate may be a flexible substrate such as a polymer substrate.

In various embodiments, the printed main circuit arrangement 308 may include at least one printed electrical component. The printed reference circuit arrangement 310 may also include at least one printed electrical component. Examples of electrical components may include transistors such as MOSFETs and BJTs as well as resistors. In various embodiments, the processor circuit 302 may also include at least one printed electrical component. Various embodiments may include a circuit arrangement that operates without a clock. The printed main circuit arrangement 308 and/or processor circuit 302 may be operated without application of a clock signal.

Figure 4:
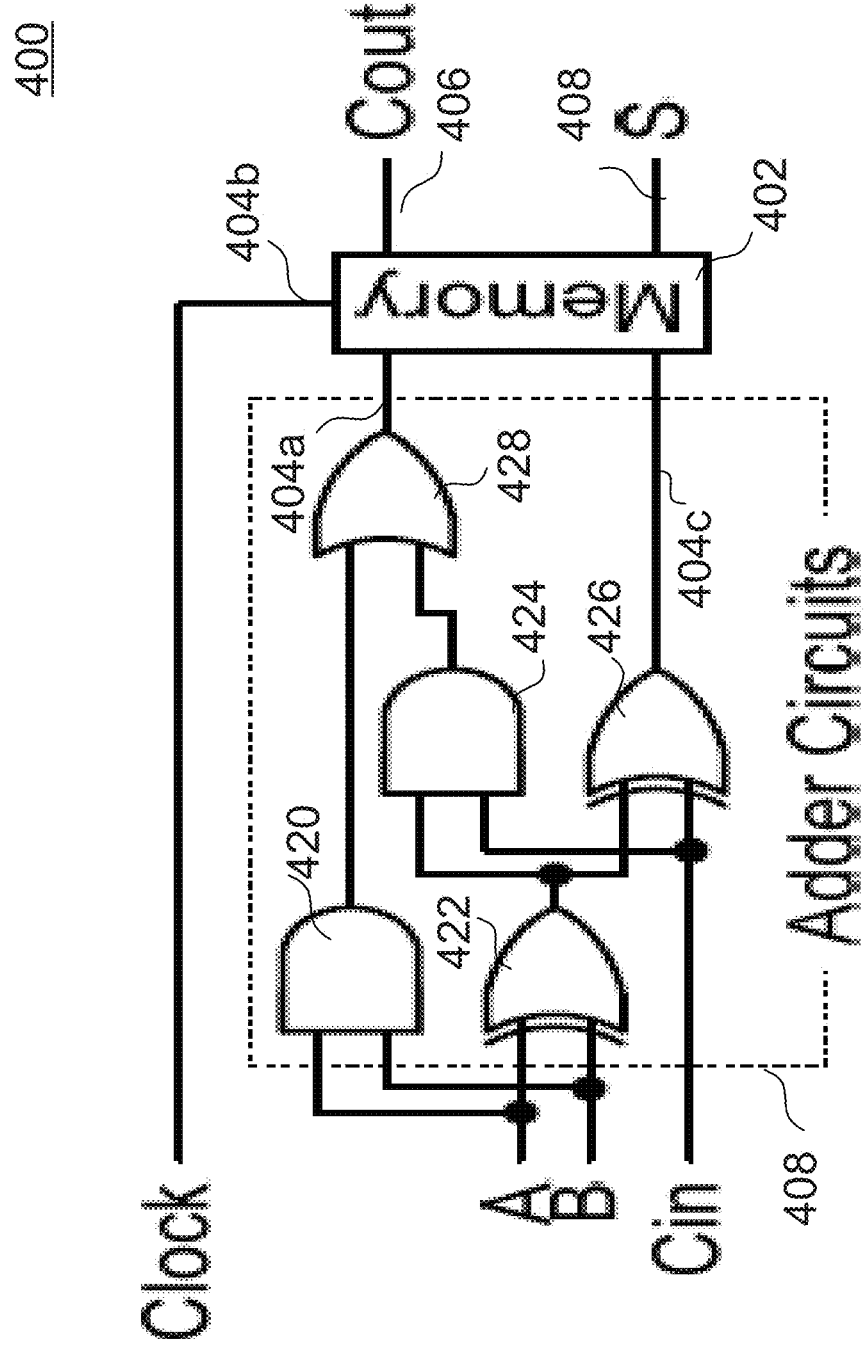
FIG. 4 is a schematic of another printed circuit arrangement.

FIG. 4 is a schematic 400 of another printed circuit arrangement. The printed circuit arrangement may include a main circuit arrangement 408. The main circuit arrangement 408 may be similar to the main circuit arrangement 308 shown in FIG. 3. Also, the main circuit arrangement 408 may be configured to receive input signals A, B and Cin. The main circuit arrangement 408 may be coupled to a processor circuit 402. The processor circuit 402 may include input nodes 404a, 404b, 404c. The processor circuit 402 may further include an output node 406 and a further output node 408. The main circuit arrangement 408 may include a 1-bit full adder. The processor circuit 402 may be or may include a memory circuit.

The main circuit arrangement 408 may include a first AND gate 420 with a first input for receiving input signal A and a second input for receiving input signal B. The main circuit arrangement 408 may also include a first XOR gate 422 with a first input for receiving the input signal A and the second input for receiving input signal B. The output of the first XOR gate 422 may be coupled to a first input of a second AND gate 424 as well as a first input of a second XOR gate 426. A second input of the second AND gate 424 and a second input of the second XOR gate 426 may be configured to receive input signal Cin. The output of the first AND gate 420 may be coupled to a first input of a OR gate 428. The output of the second AND gate 424 may be coupled to a second input of the OR gate 428. The output of the OR gate 428 may be coupled to the first input node 404a of processor circuit 402. The processor circuit 402 may further include a third input node 404c for receiving the output of second XOR gate 426.

The processor circuit 402 may be configured to generate an output signal Cout at the output node 406 based on a main circuit signal in response to a clock signal. The processor circuit 403 may further be configured to generate a further output signal S at the further output node 408 based on a further main circuit signal in response to the clock signal. The main circuit signal may be the output of the OR gate 428. The further main circuit signal may be the output of the second XOR gate 426.

The clock signal may activate the processor circuit 402 to store the results of the addition, i.e. output of the OR gate 428 and output of the second XOR gate 426. For instance, a rising edge or a falling edge of the clock signal may activate the processor circuit 402 to store the results of the addition. The clock signal may activate the processor circuit 402 to store the results of the addition after every clock delay.

The circuit arrangement illustrated in FIG. 4 may be based on synchronous logic while the circuit arrangement illustrated in FIG. 3 may be based on asynchronous logic.

Figure 5:
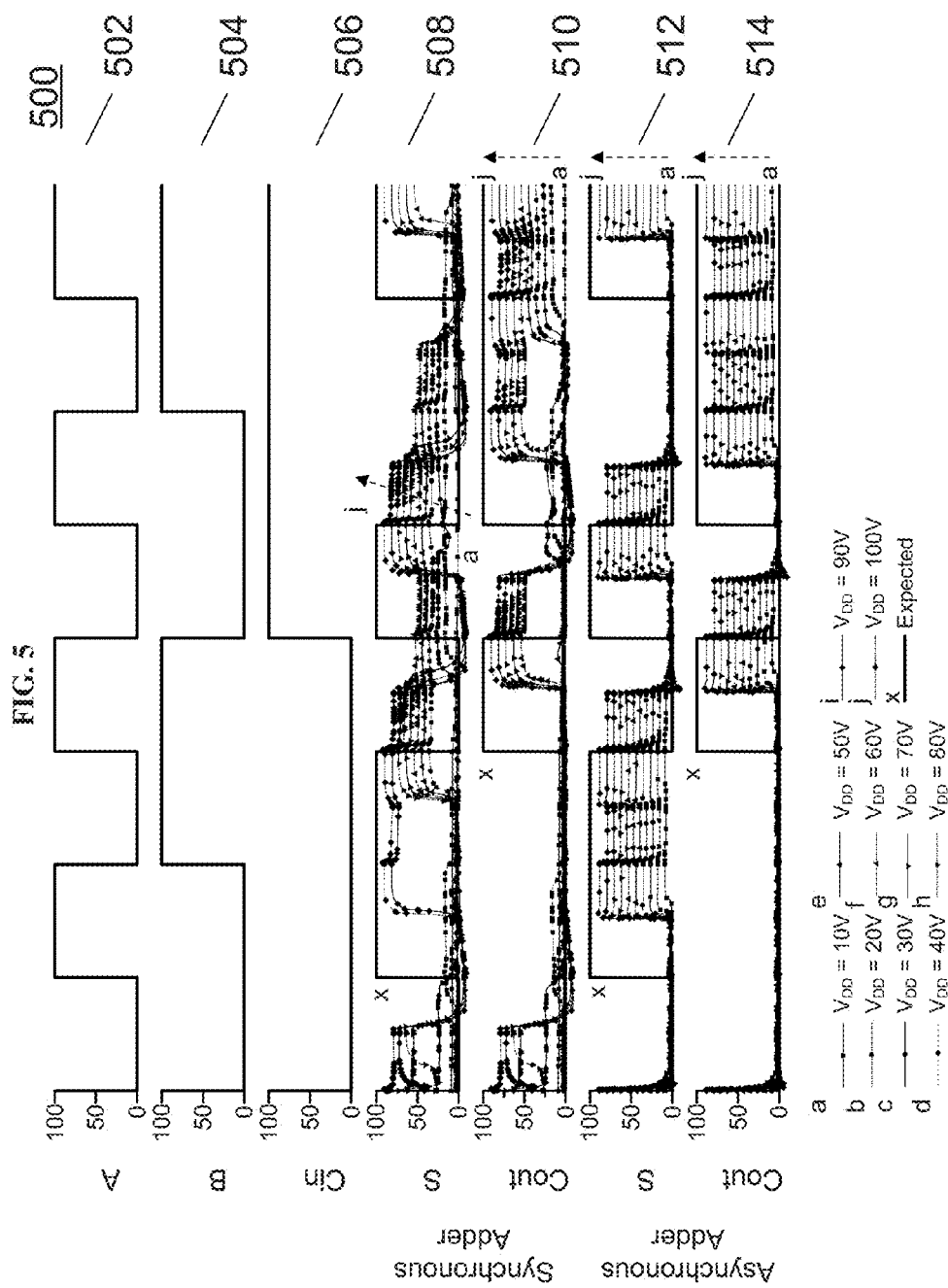
FIG. 5 shows is a plot showing the voltage variation of input signals A, B, Cin as well as corresponding output signals S and Cout as a function of time.

FIG. 5 shows is a plot 500 showing the voltage variation of input signals A, B, Cin as well as corresponding output signals S and Cout as a function of time. 502 indicates the variation of voltages for input signal A; 504 indicates the variation of voltages for input signal B; 506 indicates the variation of voltages for input signal Cin applied to both circuit arrangements illustrated in FIGS. 3 and 4. 508 indicates the variation of voltages for output signal S and 510 indicates the variation of voltages for further output signal Cout for the circuit arrangement illustrated in FIG. 4. 512 indicates the variation of voltages for output signal S and 514 indicates the variation of voltages for further output signal Cout for the circuit arrangement illustrated in FIG. 3. The transistor mobility is $7 \times 10^{-3}$ cm$^2$/Vs 502, 504, 506, 508, 510 and 512 are plotted over the same time interval. The bold lines labeled "x" in 506, 508, 510 and 512 are the expected ideal output voltages. As may be observed from FIG. 5, at a transistor mobility of $7 \times 10^{-3}$ cm$^2$/Vs, the circuit arrangement illustrated in FIG. 4 (termed synchronous adder) is relatively error free only when VDD is more than about 90V (labeled "j"), while the circuit arrangement illustrated in FIG. 3 (termed asynchronous adder) is also relatively error free for VDD from about 10V (labeled "a") to about 90V (labeled "j").

Figure 6:
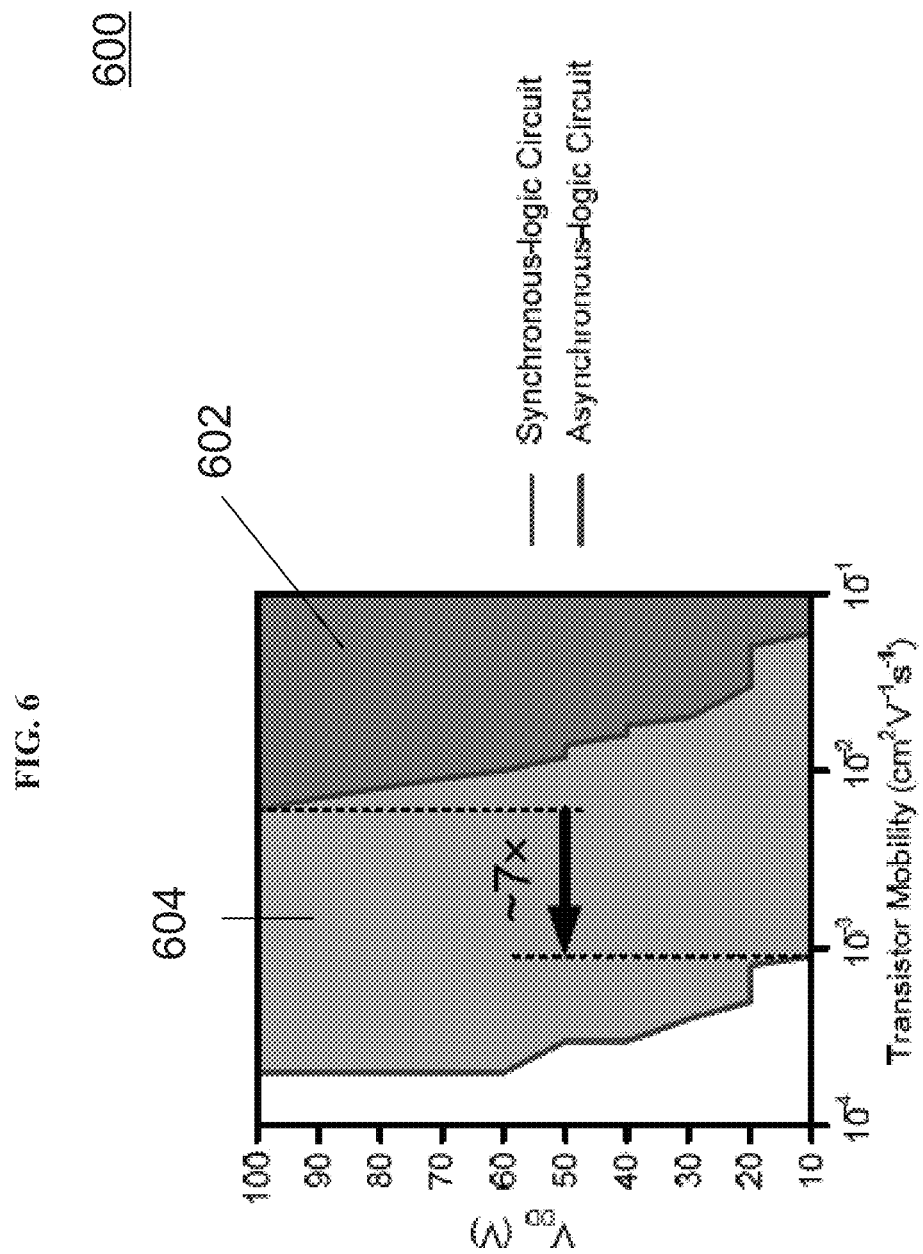
FIG. 6 is a plot of supply voltage (VDD) against transistor mobility ($cm^2\ V^{-1}\ s^{-1}$) illustrating the robustness of the circuit arrangements in FIGS. 3 and 4 when the transistor mobility degrades from $10^{-1}$ to $10^{-4}\ cm^2\ V^{-1}\ s^{-1}$.

FIG. 6 is a plot 600 of supply voltage (VDD) against transistor mobility ($cm^2\ V^{-1}\ s^{-1}$) illustrating the robustness of the circuit arrangements in FIGS. 3 and 4 when the transistor mobility degrades from $10^{-1}$ to $10^{-4}\ cm^2\ V^{-1}\ s^{-1}$. The area labeled as 602 indicates the ranges of VDD and transistor mobility in which the circuit arrangement in FIG. 4 experiences a relatively error free operation. The area labeled as 604 indicates the additional ranges of VDD and transistor mobility in which the circuit arrangement in FIG. 3 experiences a relatively error free operation. The circuit arrangement in FIG. 4 experiences a relatively error free operation for transistor mobilities between about $10^{-1}$ and about $10^{-2}\ cm^2 V^{-1}\ s^{-1}$. The circuit arrangements may be designed at 10 V power supply voltage (VDD) and with a transistor mobility of $10^{-1}\ cm^2 V^{-1}\ s^{-1}$. The transistor mobility may be varied by means of simulation. The circuit arrangement in FIG. 3 experiences a relatively error free operation for transistor mobilities between about $10^{-1}$ and about $10^{-4}\ cm^2 V^{-1}\ s^{-1}$. When the mobility of transistors degrades, error-free operation may be extended by increasing the power supply voltage (VDD). The circuit arrangement in FIG. 3 (at VDD=about 10V) may be about seven times more robust to transistor mobility variation compared to the circuit arrangement in FIG. 4 (at VDD=about 100V). The circuit arrangement in FIG. 3 may be functional at more than seven times lower transistor mobility compared to the circuit arrangement in FIG. 4. The circuit arrangement shown in FIG. 3 may feature higher robustness due to its self-timed attribute, i.e. by means of match delay circuit arrangement 312, that may accommodate variations. In contrast, the circuit arrangement in FIG. 4 may be externally timed by an independent clock signal (at about 0.2 Hz) which does not follow the actual performance of the printed main circuit arrangement over time, which may result in non-functional circuit when the printed main circuit arrangement degrades beyond the margin or the design. In other words, the circuit arrangement in FIG. 4 may be controlled by an independent clock signal which does not adapt to variation in performances.

Figure 7A:
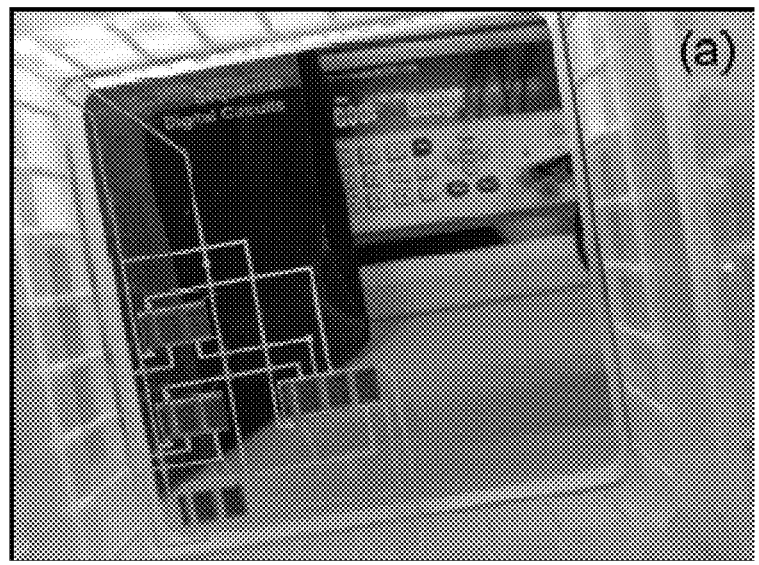
FIG. 7A is a photo of a Muller-C element according to various embodiments.
Figure 7B:
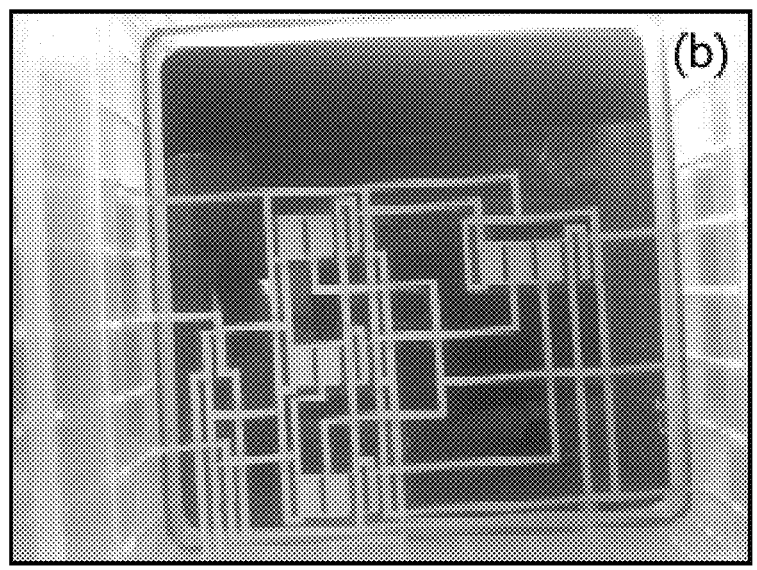
FIG. 7B is a photo of another Muller-C element according to various embodiments.
Figure 7C:
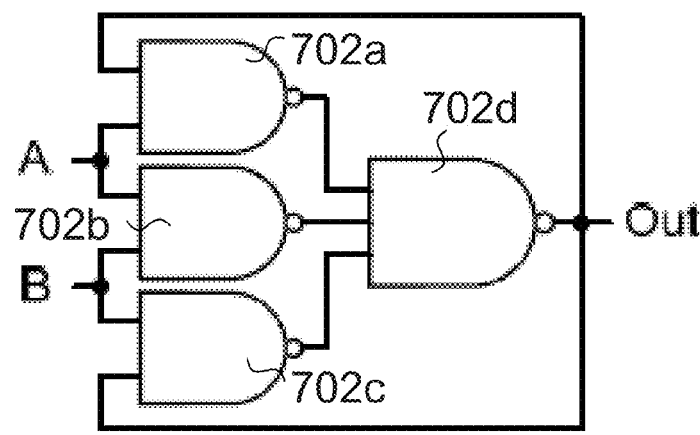
FIG. 7C is a schematic of the Muller-C element illustrated in FIG. 7A.
Figure 7D:
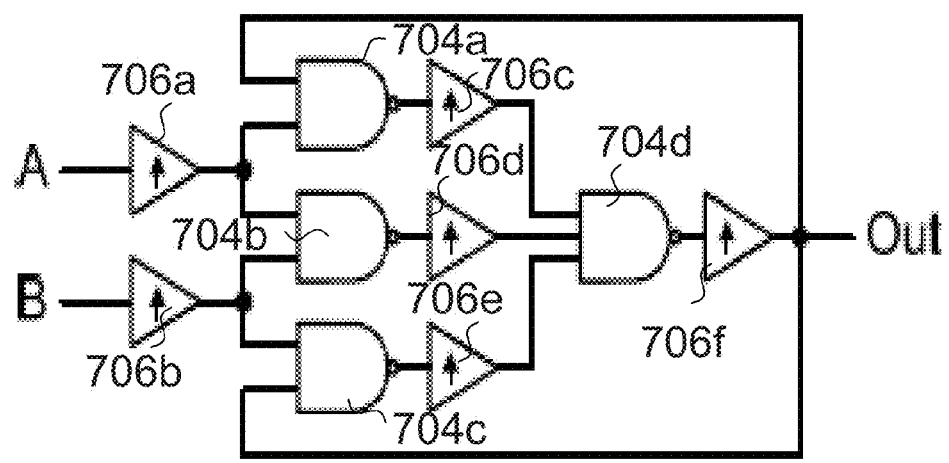
FIG. 7D is a schematic of the Muller-C element illustrated in FIG. 7B.
Figure 7E:
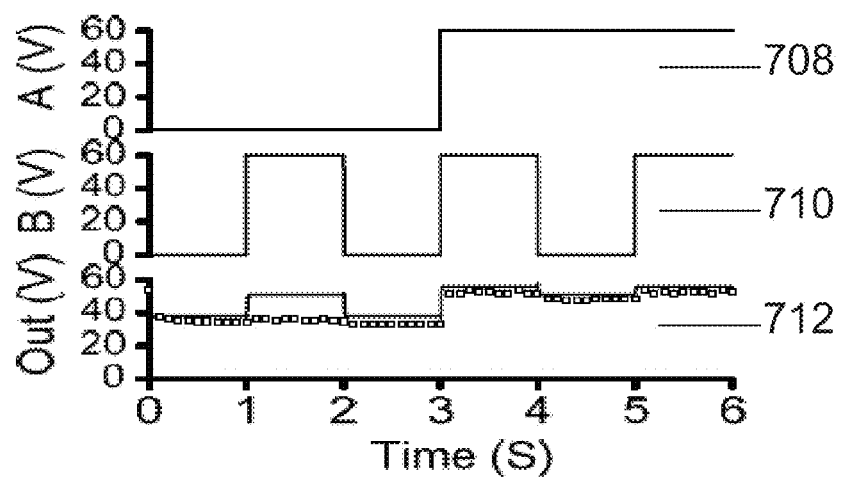
FIG. 7E is a plot of voltage (V) against time (s) of the Muller-C element illustrated in FIG. 7A.
Figure 7F:
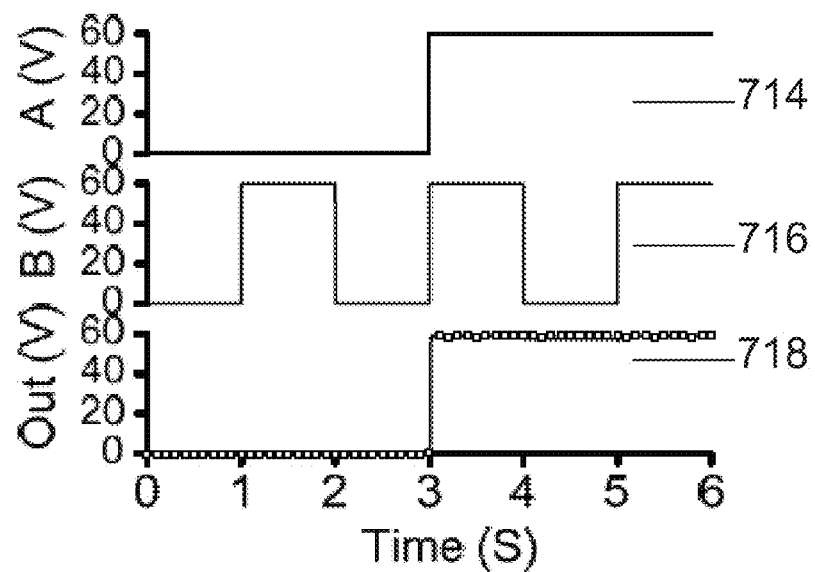
FIG. 7F is a plot of voltage (V) against time (s) of the Muller-C element illustrated in FIG. 7B.

FIG. 7A is a photo 700a of a Muller-C element according to various embodiments. FIG. 7B is a photo 700b of another Muller-C element according to various embodiments. FIG. 7C is a schematic 700c of the Muller-C element illustrated in FIG. 7A. FIG. 7D is a schematic 700d of the Muller-C element illustrated in FIG. 7B. FIG. 7E is a plot 700e of voltage (V) against time (s) of the Muller-C element illustrated in FIG. 7A. FIG. 7F is a plot 700f of voltage (V) against time (s) of the Muller-C element illustrated in FIG. 7B.

The Muller-C element in FIG. 7C may include NAND gates 702a, 702b, 702c, 702d. A first input electrode of NAND gate 702a may be configured to receive first input signal A. A first input electrode of NAND gate 702b may be configured to receive first input signal A and a second input electrode of NAND gate 702b may be configured to receive second input signal B. A first input electrode of NAND gate 702c may be configured to receive first input signal B. The outputs of NAND gates 702a, 702b, 702c may be coupled to NAND gate 702d. The output of NAND gate 702d may be the output of the Muller-C element. The output of NAND gate 702d may be coupled to a second input of NAND gate 702a and a second input of NAND gate 702c. In various embodiments, the A signal may be the reference circuit signal generated by the printed reference circuit arrangement 312 and the B signal may be the Acknowledge In signal as shown in FIG. 3. In various alternate embodiments, the B signal may be the reference circuit signal generated by the printed reference circuit arrangement 312 and the A signal may be the Acknowledge In signal as shown in FIG. 3.

The Muller-C element in FIG. 7D may include NAND gates 704a, 704b, 704c, 704d. The Muller-C element in FIG. 7D may further include delay elements 706a, 706b, 706c, 706d, 706e, 706f. The input of delay element 706a may be configured to receive first input signal A. The input of delay element 706b may be configured to receive second input signal B. The output of delay element 706a may be coupled to a first input of NAND gate 704a and a first input of NAND gate 704b. The output of delay element 706b may be coupled to a second input of NAND gate 704b and the first input of NAND gate 704c. The output of NAND gate 704a may be coupled to the input of delay element 706c; the output of NAND gate 704b may be coupled to the input of delay element 706d and the output of NAND gate 704c may be coupled to the input of delay element 706e. The outputs of NAND gates 706c, 706d, 706e may be coupled to NAND gate 704d. The output of NAND gate 704d may be coupled to delay element 706f. The output of delay element 706f may be the output of the Muller-C element. The output of delay element 706f may be coupled to a second input of NAND gate 704a and a second input of NAND gate 704c. In various embodiments, the A signal may be the reference circuit signal generated by the printed reference circuit arrangement 312 and the B signal may be the Acknowledge In signal as shown in FIG. 3. In various alternate embodiments, the B signal may be the reference circuit signal generated by the printed reference circuit arrangement 312 and the A signal may be the Acknowledge In signal as shown in FIG. 3.

708 indicates the variation of input signal A applied to the Muller-C element in FIG. 7A. 710 indicates the variation of input signal B applied to the Muller-C element in FIG. 7A. 712 indicates the variation of output signal Out generated by the Muller-C element in FIG. 7A. 714 indicates the variation of input signal A applied to the Muller-C element in FIG. 7B. 716 indicates the variation of input signal B applied to the Muller-C element in FIG. 7B. 718 indicates the variation of output signal Out generated by the Muller-C element in FIG. 7B. For the output voltages indicated by 712, 718 in FIGS. 7E and 7F respectively, the simulated voltages are indicated by the solid line while the measured voltages are indicated by the square boxes (□).

The Muller C-element is a rudimentary logic gate for asynchronous logic circuits. The Muller C-element may be printed. The implementation in shown in FIG. 7A may require 13 transistors and may have an output voltage swing of about VDD/3 (shown in FIG. 7E). Generally, the desired output voltage swing of digital circuits should be as large as possible—the maximum voltage swing is VDD. The Muller-C element in FIG. 7B may address the need for a large voltage swing. The implementation in FIG. 7B may require 25 transistors and may features an output voltage swing of about VDD (shown FIG. 7F).

FIG. 8 shows a schematic 800 of forming a printed circuit arrangement. The method may include, in 802, providing a processor circuit having a first input node, a second input node and an output node. The method may further include, in 804, electrically connecting a printed main circuit arrangement with the first input node of the processor circuit. The printed main circuit arrangement may be configured to receive at least one input signal and generate a main circuit signal based on the at least one input signal after a first delay from receiving the at least one input signal. The method may also include, in 806, electrically connecting a printed reference circuit arrangement with the second input node of the processor circuit. The printed reference circuit arrangement may have a second delay and may be configured such that the second delay adapts to the first delay and may be configured to generate a reference circuit signal based on the further input signal after the second delay from receiving the further input signal. The processor circuit may be configured to generate an output signal at the output node based on the main circuit signal in response to the reference circuit signal.

The method may further include printing at least one electrical component of the printed main circuit on a substrate using conductive ink. The method may also include printing at least one electrical component of the printed reference circuit arrangement on the substrate within the predetermined range from the printed main circuit using conductive ink.

Electrically connecting the printed main circuit arrangement with the first input node of the processor circuit may include using conductive ink to electrically connect the printed main circuit arrangement with the first input node of the processor circuit.

Electrically connecting the printed reference circuit arrangement with the second input node of the processor circuit may include using conductive ink to electrically connect the printed reference circuit arrangement with the second input node of the processor circuit.

Various embodiments may include digital circuits that accommodate poor stability of printed devices. Various embodiments may include digital circuits that accommodate poor repeatability of printed devices. Various embodiments may include digital circuits that can accommodate the broad range of printed transistor performance distribution. Various embodiments may include digital circuits that are more robust to degradation of transistor parameters. Various embodiments may include digital circuits that do not require excessive margins (which reduces circuit performance) to compensate the sparse distribution of printed transistor parameters. Various embodiments may make the transistor performance and circuit functionality independent. Various embodiments may lead to increased functionality for printed integrated circuits (printed IC) because the reliability/functionality of the circuits is insensitive to the degradation and/or distribution of transistor parameters. Various embodiments may be technologically significant to develop printed functional integrated circuits that can meet application requirements. Various embodiments may resolve the all-time contradiction between low cost printed transistors and reliable printed circuits. Low-cost printed transistors may incur large variations and degrade over time, whereas reliable printed circuits typically require consistent and reliable transistor performance. Various embodiments may enable highly reliable and high performance printed circuits by reducing their dependence on printed transistor consistency and performance degradation. Various embodiments may include circuit arrangements with more reliable and higher performance for low cost and flexible products for industry applications. Current art practical printed circuits may require combined printing and traditional lithography-based patterning techniques in order to address repeatability and stability challenges which may inevitably increase costs. Various embodiments may innately accommodate the repeatability and stability issues and allow full exploitation of low-cost aspects of printing. Various embodiments may only require low cost printing technologies. Various embodiments may ease the barrio encapsulation requirements. Various embodiments may ease the operating lifetime of printed circuits. Various embodiments may be used or employed in printed electronics, printed circuits, printed memory, printed sensors, printed intelligence and/or commercial applications that require use of printed transistors. Various embodiments may lead to lower energy circuits, lower electromagnetic interference and/or higher speed.

Methods described herein may further contain analogous features of any printed circuit arrangement or component of a printed circuit arrangement described herein. Correspondingly, a printed circuit arrangement or component of a printed circuit arrangement described herein may further contain analogous features of any methods described herein.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A printed circuit arrangement comprising:
    a processor circuit having a first input node, a second input node and an output node;
    a printed main circuit arrangement in electrical connection with the first input node of the processor circuit, the printed main circuit arrangement configured to receive at least one input signal and generate a main circuit signal based on the at least one input signal after a first delay from receiving the at least one input signal; and
    a printed reference circuit arrangement in electrical connection with the second input node of the processor circuit, the printed reference circuit arrangement configured to receive a further input signal, wherein the printed reference circuit arrangement has a second delay and is configured such that the second delay adapts to the first delay and is configured to generate a reference circuit signal based on the further input signal after the second delay from receiving the further input signal;
    wherein the processor circuit is configured to generate an output signal at the output node based on the main circuit signal in response to the reference circuit signal.

2. The printed circuit arrangement according to claim 1, wherein the second delay is within a predetermined range of the first delay.

3. The printed circuit arrangement according to claim 1, wherein the printed reference circuit arrangement comprises a match delay circuit arrangement, the match delay circuit arrangement configured to receive the further input signal.

4. The printed circuit arrangement according to claim 3, wherein the printed reference circuit arrangement further comprises a Muller-C element.

5. The printed circuit arrangement according to claim 4, wherein the Muller-C element has a first input, a second input and an output;
    wherein the first input of the Muller-C element is coupled to the match delay circuit; and
    wherein the output of the Muller-C element is coupled to the processor circuit.

6. The printed circuit arrangement according to claim 5, wherein the second input of the Muller-C element is configured to receive an additional input signal.

7. The printed circuit arrangement according to claim 1, wherein the main circuit arrangement is an adder circuit.

8. The printed circuit arrangement according to according to claim 1,
wherein the printed main circuit arrangement comprises a logic circuit; and
wherein the printed reference circuit arrangement comprises a further logic circuit complementary to the logic circuit.

9. The printed circuit arrangement according to claim 1, wherein the processor circuit comprises a memory circuit.

10. The printed circuit arrangement according to claim 1, wherein the printed reference circuit arrangement has a rate of degradation substantially equal to a rate of degradation of the printed main circuit arrangement.

11. The printed circuit arrangement according to claim 1, wherein the processor circuit is configured to generate the output signal at the output node upon receiving the reference circuit signal.

12. The printed circuit arrangement according to claim 1,
wherein the printed main circuit arrangement comprises conductive ink printed on a substrate; and
wherein the printed reference circuit arrangement comprises conductive ink printed on the substrate.

13. The printed arrangement according to claim 12, wherein the substrate is a flexible substrate.

14. The printed circuit arrangement according to claim 1, wherein the processor circuit is a printed circuit arrangement.

15. The printed circuit arrangement according to claim 1,
wherein the printed main circuit arrangement comprises at least one printed electrical component; and
wherein the printed reference circuit arrangement comprises at least one printed electrical component.

16. The printed circuit arrangement according to claim 1, wherein the printed reference circuit arrangement is within a predetermined distance from the printed main circuit arrangement.

17. A method of forming a printed circuit arrangement, the method comprising:
providing a processor circuit having a first input node, a second input node and an output node;
electrically connecting a printed main circuit arrangement with the first input node of the processor circuit, the printed main circuit arrangement configured to receive at least one input signal and generate a main circuit signal based on the at least one input signal after a first delay from receiving the at least one input signal; and
electrically connecting a printed reference circuit arrangement with the second input node of the processor circuit, the printed reference circuit arrangement configured to receive a further input signal, wherein the printed reference circuit arrangement has a second delay and is configured such that the second delay adapts to the first delay and is configured to generate a reference circuit signal based on the further input signal after the second delay from receiving the further input signal;
wherein the processor circuit is configured to generate an output signal at the output node based on the main circuit signal in response to the reference circuit signal.

18. The method according to claim 17, the method further comprising:
printing at least one electrical component of the printed main circuit on a substrate using conductive ink; and
printing at least one electrical component of the printed reference circuit arrangement on the substrate within the predetermined range from the printed main circuit using conductive ink.

19. The method according to claim 17,
wherein electrically connecting the printed main circuit arrangement with the first input node of the processor circuit comprises using conductive ink to electrically connect the printed main circuit arrangement with the first input node of the processor circuit.

20. The method according to claim 17,
wherein electrically connecting the printed reference circuit arrangement with the second input node of the processor circuit comprises using conductive ink to electrically connect the printed reference circuit arrangement with the second input node of the processor circuit.

* * * * *

UNITED STATES PATENT AND TRADEMARK OFFICE
CERTIFICATE OF CORRECTION

PATENT NO. : 9,577,620 B2  
APPLICATION NO. : 14/329913  
DATED : February 21, 2017  
INVENTOR(S) : Kok Leong Chang et al.

Page 1 of 1

It is certified that error appears in the above-identified patent and that said Letters Patent is hereby corrected as shown below:

On the Title Page

Item (30), Foreign Application Priority Data

Please replace priority application number "201305367" with --201305367-3--

Signed and Sealed this
Second Day of May, 2017

Michelle K. Lee
*Director of the United States Patent and Trademark Office*